United States Patent
Chiu et al.

(10) Patent No.: US 11,848,221 B2
(45) Date of Patent: Dec. 19, 2023

(54) METHOD OF STORING WORKPIECE USING WORKPIECE STORAGE SYSTEM

(71) Applicant: TAIWAN SEMICONDUCTOR MANUFACTURING CO., LTD., Hsinchu (TW)

(72) Inventors: Tzu-Chi Chiu, Taichung (TW); Jen-Ti Wang, Taichung (TW); Ting-Wei Wang, Taichung (TW); Kuo-Fong Chuang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/871,984

(22) Filed: Jul. 25, 2022

(65) Prior Publication Data
US 2022/0359252 A1 Nov. 10, 2022

Related U.S. Application Data

(63) Continuation of application No. 16/520,599, filed on Jul. 24, 2019, now Pat. No. 11,437,258.

(60) Provisional application No. 62/725,198, filed on Aug. 30, 2018.

(51) Int. Cl.
| H01L 21/673 | (2006.01) |
| H01L 21/677 | (2006.01) |
| H01L 21/67 | (2006.01) |
| G05B 15/00 | (2006.01) |

(52) U.S. Cl.
CPC ........ *H01L 21/67769* (2013.01); *G05B 15/00* (2013.01); *H01L 21/677* (2013.01); *H01L 21/67265* (2013.01); *H01L 21/67294* (2013.01); *H01L 21/67389* (2013.01)

(58) Field of Classification Search
CPC ........ H01L 21/67271; H01L 21/67294; H01L 21/673; H01L 21/67303
See application file for complete search history.

(56) References Cited

U.S. PATENT DOCUMENTS

| | | |
|---|---|---|
| 2005/0075748 A1 | 4/2005 | Gartland et al. |
| 2007/0144118 A1 | 6/2007 | Alvarez |
| 2007/0278428 A1 | 12/2007 | Zani et al. |
| 2011/0232844 A1 | 9/2011 | Hofmeister et al. |
| 2015/0003941 A1 | 1/2015 | Takahara |
| 2015/0003942 A1* | 1/2015 | Takahara .......... H01L 21/67733 414/277 |

(Continued)

FOREIGN PATENT DOCUMENTS

| | | |
|---|---|---|
| TW | 200415095 A | 8/2004 |
| TW | 201810473 A | 3/2018 |

*Primary Examiner* — Jae Lee
(74) *Attorney, Agent, or Firm* — Maschoff Brennan

(57) ABSTRACT

A method includes disposing, by using a transport module of a workpiece storage system, a first workpiece on a first workpiece carrier; disposing, by using the transport module, the first workpiece carrier with the first workpiece in a workpiece container; disposing, by using the transport module, a second workpiece in the workpiece container, wherein the first workpiece and the second workpiece have different sizes; and transferring, by using the transport module, the workpiece container containing the second workpiece and the first workpiece carrier with the first workpiece to a stocker to store the workpiece container.

20 Claims, 8 Drawing Sheets

(56) References Cited

U.S. PATENT DOCUMENTS

| | | | |
|---|---|---|---|
| 2015/0187622 A1* | 7/2015 | Johnson | H01L 21/68 |
| | | | 438/464 |
| 2016/0370797 A1 | 12/2016 | Azarya | |
| 2017/0372924 A1 | 12/2017 | Bello et al. | |
| 2018/0122674 A1 | 5/2018 | Dovids | |
| 2018/0122677 A1* | 5/2018 | Dovids | B65G 37/02 |

* cited by examiner

METHOD OF STORING WORKPIECE USING WORKPIECE STORAGE SYSTEM

PRIORITY CLAIM AND CROSS-REFERENCE

This application is a continuation application of the U.S. application Ser. No. 16/520,599, filed Jul. 24, 2019, which claims priority to U.S. provisional application Ser. No. 62/725,198, filed on Aug. 30, 2018, which is hereby incorporated by reference in its entirety.

BACKGROUND

In the semiconductor manufacturing industry, a semiconductor fabrication facility (FAB) may include one or more floors having a plurality of processing bays therein. The processing bays may be furnished with various processing tools and/or wafer storing equipment for performing various semiconductor manufacturing processes. In order to automatically handle and transport a group of workpieces like wafers between the various processing tools and/or wafer storing equipment, an automated material handling system (AMHS) is widely used in the FAB. Consequently, the AMHS may transport different types of the workpieces to their corresponding storage spaces respectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
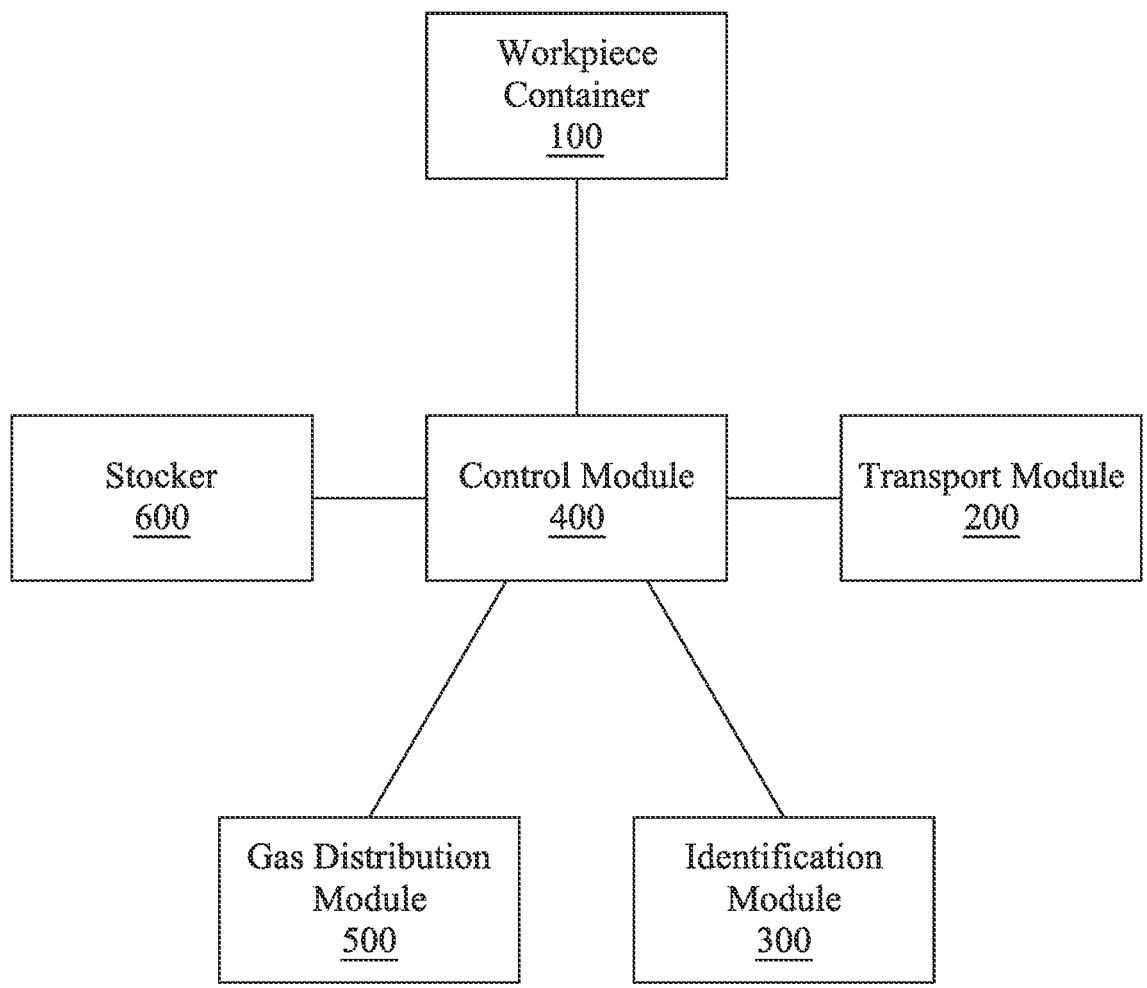
FIG. 1 is a schematic diagram illustrating a workpiece storage system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "substantially" or "approximately" shall generally mean within 20 percent, within 10 percent, or within 5 percent of a given value or range. Numerical quantities given herein are approximate, meaning that the term "around," "about," "substantially" or "approximately" can be inferred if not expressly stated.

In a semiconductor fabrication facility (FAB), a variety of workpieces (e.g., finished products, semi-finished products, photomasks) are frequently transported between various processing tools in corresponding bays, so as to carry out different semiconductor manufacturing processes. When these workpieces are in an idle state and/or waiting for the next semiconductor manufacturing process, a variety of stockers in the FAB may be used to temporarily store these workpieces. However, these workpieces are mostly stored in different storage conditions, so that these workpieces may not be stored in the same place. The stockers occupy a large storage area in FAB, but most of the stockers are in the idle states. Further, if these workpieces are put in the same place, there may be a risk of mutual contamination between these workpieces. Consequently, in an effort to adequately address the above-mentioned issues, a workpiece container, a workpiece storage system, and a method of storing a workpiece are presented in accordance with various embodiments of the present disclosure as follows.

Reference is made to FIG. 1, which is a schematic diagram illustrating a workpiece storage system 10 in accordance with some embodiments of the present disclosure. In some embodiments, the workpiece storage system 10 of the present disclosure may mainly include at least one workpiece container 100, a transport module 200, at least one identification module 300, a gas distribution module 500, at least one stocker 600, and a control module 400, so as to carry out the method of storing a workpiece of the present disclosure. The control module 400 may interconnect between each module mentioned above to facilitate function of the workpiece storage system 10. In some embodiments, the workpiece storage system 10 may include a plurality of identification module 300 respectively at different positions in FAB. In order to make the system and method more understood, more detailed descriptions thereof will be sequentially and discretely presented as follows.

Figure 2:
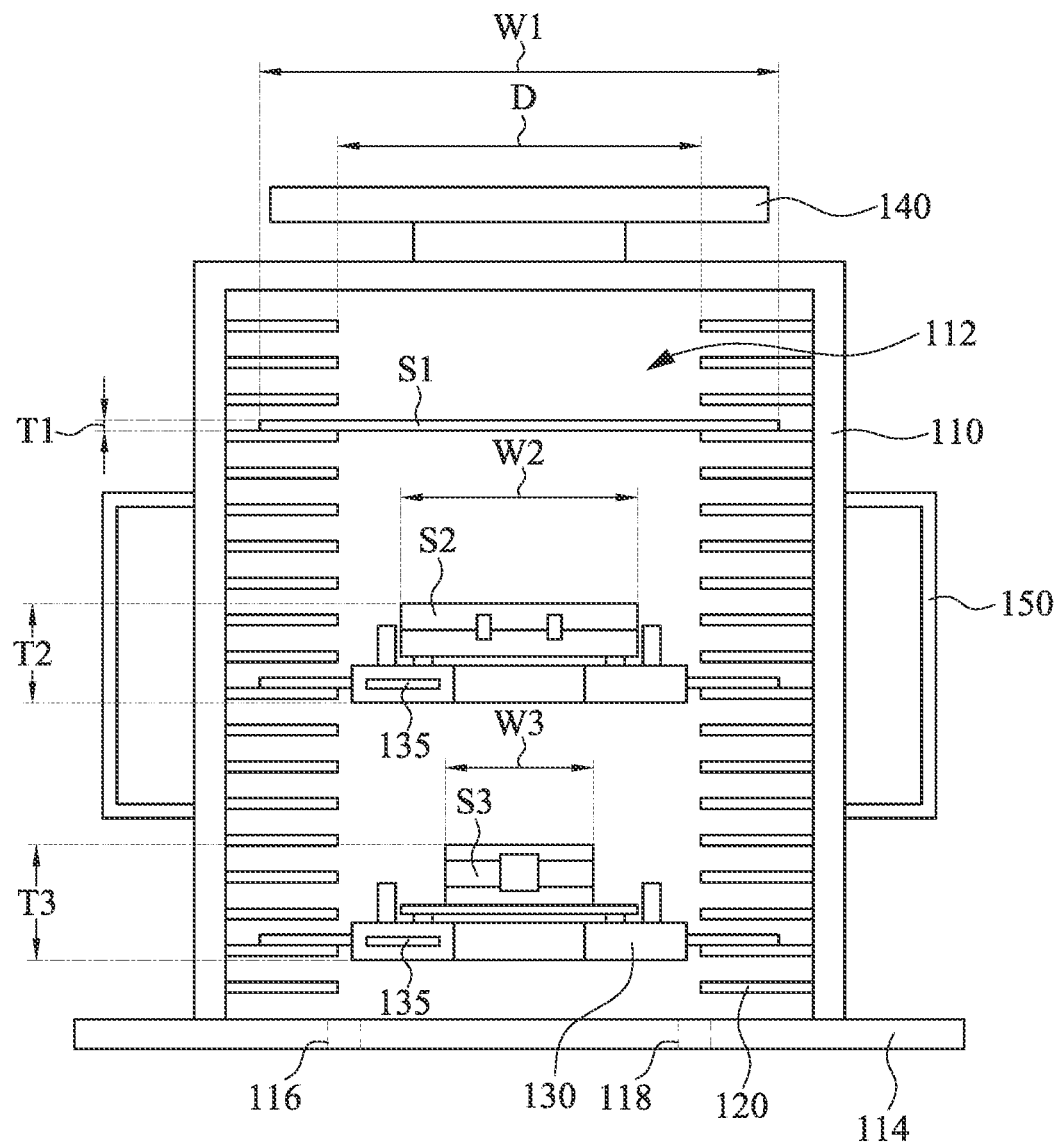
FIG. 2 is a schematic diagram illustrating a workpiece container in accordance with some embodiments of the present disclosure.

Reference is made to FIG. 2, which is a schematic diagram illustrating the workpiece container 100 in accordance with some embodiments of the present disclosure. More specifically, the workpiece container 100 may be a front opening unified pod (FOUP), a standard mechanical interface (SMIF) container, combinations thereof, or the like. In some embodiments, as shown in FIG. 1, the workpiece container 100 includes a housing 110, a supporting structure 120, and at least one workpiece carrier 130. The housing 110 defines an internal space 112 therein that may be accessible through a detachable cover (e.g., a front opening) of the housing 110. The supporting structure 120 may include a plurality of supports that are respectively configured on inner sidewalls of the housing 110. Each workpiece carrier 130 may be a movable platform with adjustable structures to retain one of different types of workpieces thereon.

In some embodiments, as shown in FIG. 2, through the supporting structure 120, a variety of workpieces may be positioned in the internal space 112 of the housing 110. It is noted that, with respect to the supporting structure 120, two horizontally adjacent supports thereof may collectively form a floor thereof, so that a plurality of floors may be provided in the internal space 112 of the housing 110 for containing a plurality of workpieces thereon. For example, a wafer S1 may be directly positioned on one of the floors of the supporting structure 120. For another example, a wafer pod S2 and a photomask box S3 may be retained by different workpiece carriers 130 respectively, and then, separately positioned on different floors of the supporting structure 120. It is also noted that the vertical distance and/or the horizontal distance between two adjacent supports of the supporting structure 120 may be adjustable based on various designs, such that a variety of workpieces with different widths may be fit in the supporting structure 120. In other words, different types of workpieces may be selectively positioned inside the workpiece container 100 at the same time, so as to render the following adaptable storage of the various workpieces. Consequently, applicability of the workpiece container 100 may be improved.

It is noted that the aforementioned workpiece may be any of the group including wafer, wafer box, wafer pod, photomask box, photomask pod, standard mechanical interface (SMIF) device, combinations thereof, or the like. Additionally, the workpiece may be a finished product or a semi-finished product.

In some embodiments, as shown in FIG. 2, a bottom wall 114 of the housing 110 is equipped with at least one gas inlet 116 at one side of the housing 110 and at least one gas outlet 118 at another side of the housing 110. Through the gas inlet 116 and the gas outlet 118, the gas distribution module 500 (as shown in FIG. 1) may be in gaseous communication with the internal space 112 of the workpiece container 100. It is noted that different number and positioning of the gas inlet 116 and the gas outlet 118 are contemplated and within the scope of the present disclosure.

In some embodiments, the workpiece container 100 may include a robotic flange 140. The robotic flange 140 may be a protruding structure on the top of the housing 110. In some embodiments, the robotic flange 140 may be installed at the center of the top surface of the housing 110, such that the transport module 200 (e.g., the transfer module 200 such as an overhead hoist transfer (OHT) as shown in FIG. 1) in a FAB may stably lift up the workpiece container 100 by grasping the robotic flange 140. In some embodiments, the workpiece container 100 may include a pair of handles 150. The pair of handles 150 may be respectively configured on outer sidewalls of the housing 110. Further, the pair of handles 150 may be attached to opposite outer sidewalls of the housing 110 to facilitate carrying of the workpiece container 100 by the transport module 200 and/or a FAB employee. In some embodiments, inclination of the handles 150 may be adjustable to make the carrying of the workpiece container 100 more convenient.

Figure 3A:
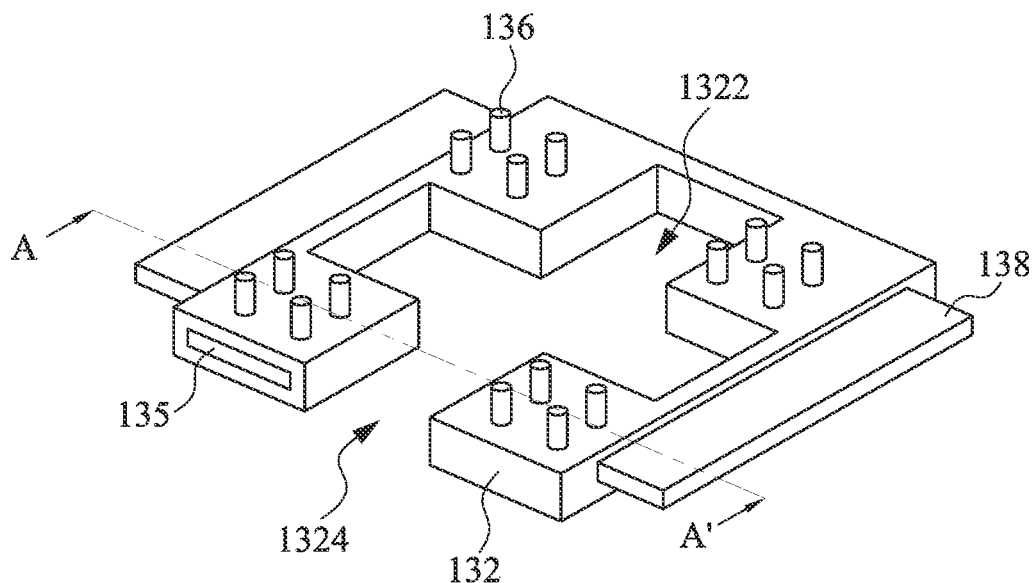
FIG. 3A is a schematic diagram illustrating a perspective view of a workpiece carrier in accordance with some embodiments of the present disclosure.
Figure 3B:
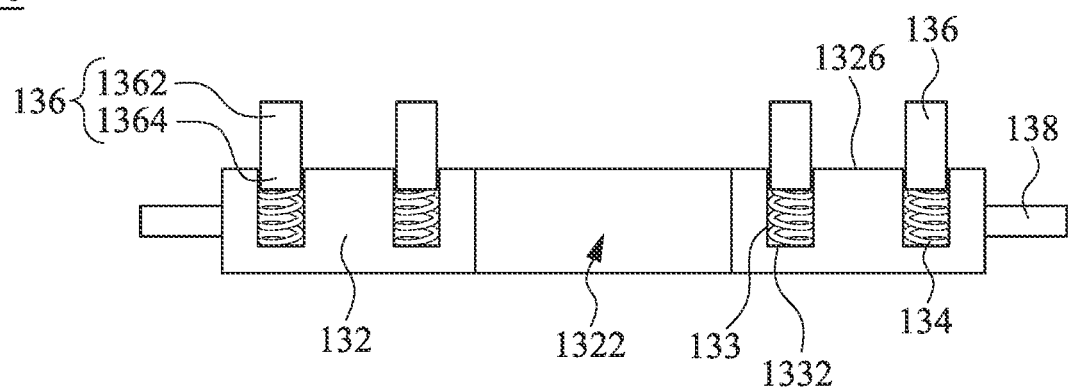
FIG. 3B is a schematic diagram illustrating a cross-section view taking along line A-A' of FIG. 3A.

Reference is made to FIGS. 3A and 3B. FIG. 3A is a schematic diagram illustrating a perspective view of the workpiece carrier 130 in accordance with some embodiments of the present disclosure. FIG. 3B is a schematic diagram illustrating a cross-section view taking along line A-A' of FIG. 3A. More specifically, the workpiece carrier 130 includes a platform 132, a plurality of bores 133 (as shown in FIG. 3B), a plurality of springs 134, a plurality of pins 136, and a support portion 138. The platform 132 has a hollow 1322 that penetrates through the platform 132 and forms a void in the platform 132. The bores 133 are formed in the platform 132 and distributed around the hollow 1322. The springs 134 are configured in the bores 133. The pins 136 are attached onto the springs 134 respectively. When one of the aforementioned workpieces is loaded on a portion of the pins 136, the springs 134 under the portion of the pins 136 are pressed, such that the portion of the pins 136 may vertically descend in the corresponding bores 133. Conversely, when one of the aforementioned workpieces is unloaded from the portion of the pins 136, the springs 134 under the portion of the pins 136 may generate a resilient force after being pressed, such that the portion of the pins 136 may vertically ascend to their initial position.

In some embodiments, the platform 132 may have a variety of profiles viewed from a top direction, e.g., a rectangular profile as shown in FIGS. 3A and 3B. The profile of the platform 132 may be adjustable based on configuration of the supporting structure 120 and/or shape of the workpiece loaded thereon, so as to improve the storage stability of the workpiece. On the other hand, in some embodiments, the support portion 138 may have a pair of plate-shaped structures that horizontally extend beyond opposite sidewalls of the platform 132 to enable positioning of the workpiece carrier 130 in the supporting structure 120 (as shown in FIG. 2). It is noted that dimension (e.g., width, length, and/or thickness) of the plate-shaped structure may be adjustable based on configuration of the supporting structure 120 and/or profile of the platform 132, such that the workpiece carrier 130 may be firmly supported by the supporting structure 120.

Figure 5:
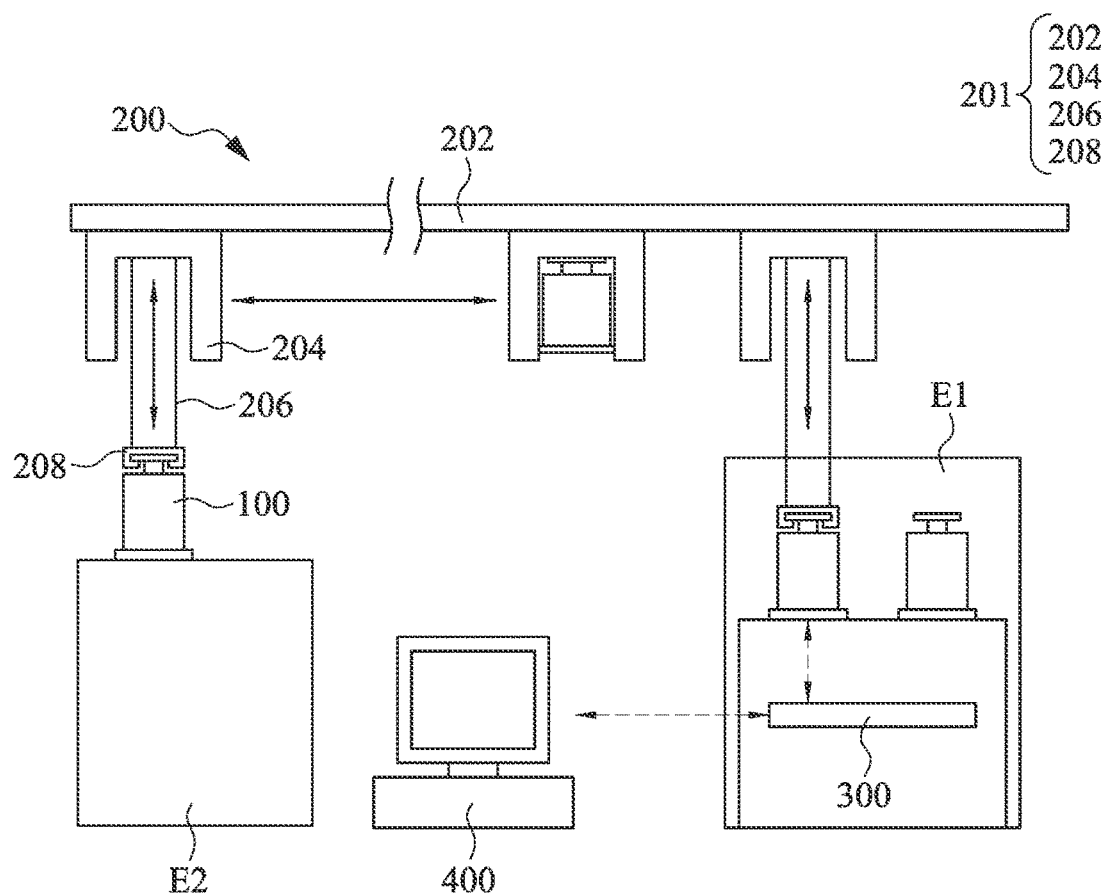
FIG. 5 is a schematic diagram illustrating the workpiece containers, a transport module, an identification module, and a control module of FIG. 1 in accordance with some embodiments of the present disclosure.

In some embodiments, the hollow 1322 may have a cross-shaped profile viewed from a top direction. Due to the configuration of the hollow 1322, a gripper 208 (as shown in FIG. 5) of the transport module 200 (e.g., an overhead hoist transfer (OHT)) may pass through the hollow 1322 to load a workpiece on the platform 132 or unload a workpiece from the platform 132 along a vertical direction. In some embodiments, as shown in FIG. 3A, the hollow 1322 may have an opening 1324 that is formed at a front side of the platform 132, such that an arm of the transport module 200 (e.g., a rail guided vehicle (RGV), an automated guided vehicle (AGV), or the like) may pass through the hollow 1322 and the opening 1324 to load a workpiece on the platform 132 or unload a workpiece from the platform 132 along vertical and horizontal directions. It is noted that configurations (e.g., profile shape and position on the platform 132) of the hollow 1322 may be adjustable based on various designs. For example, in some embodiments, the hollow 1322 may have an enclosed profile, i.e., the opening 1324 is omitted, such that structural strength of the workpiece carrier 130 may be increased.

In some embodiments, as shown in FIG. 3B, the bores 133 may be formed on a top surface 1326 of the platform 132 and extend toward a bottom surface of the platform 132. Further, each of the bores 133 may be a blind hole, which does not penetrate through the platform 132, such that each of the bores 133 may have a bore bottom 1332 where each of the springs 134 is correspondingly disposed thereon. Each of the springs 134 may have two ends that are in contact with the corresponding pin 136 and the corresponding bore bottom 1332 respectively. In other words, a pin 136 may be connected with a bore bottom 1332 through a spring 134. Consequently, when a workpiece is loaded on or unloaded from the pins 136, the pins 136 may be movable along a vertical direction in the corresponding bores 133 due to operation of the springs 134.

In some embodiments, each of the pins 136 may have an elongated structure. When the workpiece carrier 130 is free of a workpiece, a top portion 1362 of each of the pins 136 may be located above the top surface 1326 of the platform 132 and a bottom portion 1364 of each of the pins 136 may be located inside the corresponding bore 133, such that the pins 136 may be stably held by the corresponding bores 133, so as to facilitate moving of the pins 136 therein. It is noted that a profile of the bore 133 (viewed from a top direction) may be correspondent with a cross section of the pin 136, such that the pins 136 may be restrained to substantially move along a vertical direction. In some embodiments, as shown in FIG. 2, when a workpiece (i.e., the wafer pod S2 or the photomask box S3) is loaded on the workpiece carrier 130, the pressed pins 136 may be downwardly moved to make the workpiece descend simultaneously, such that the other pins 136 that remain at their initial positions may collectively act as a fence to surround sides of the workpiece and thus prevent the workpiece from moving.

In some embodiments, the pins 136 are arranged in an array distribution that surrounds the hollow 1322. More specifically, the pins 136 are held by the platform 132 and parallel to one another in a series of columns and rows, such that top portions 1362 of the pins 136 may collectively form a flat virtual plane that is adaptable to a variety of workpieces with different shapes. For example, as shown in FIGS. 2, 3A, and 3B, the pins 136 are arranged in a 4×4 distribution on the platform 132. When a workpiece is loaded on the workpiece carrier 130, the inner four pins 136 may be pressed to descend and the outer twelve pins 136 may remain at their initial positions to abut against sides of the workpiece. It is noted that number of the pins 136 may be adjustable based on various designs, e.g., the pins 136 may be arranged in a n×m distribution (e.g., the n and m may be any of positive integers). Consequently, the workpiece may be firmly settled on the workpiece carrier 130 through the pins 136.

In addition to the aforementioned array distribution, the pins 136 may be also arranged in a variety of distributions based on a profile of a workpiece (viewed from a top direction), e.g., in a circular distribution. Further, a density of the pins 136 may be adjustable based on various designs, such that the workpiece carrier 130 can be more adaptable to workpieces with different profile (viewed from a top direction).

Figure 7:
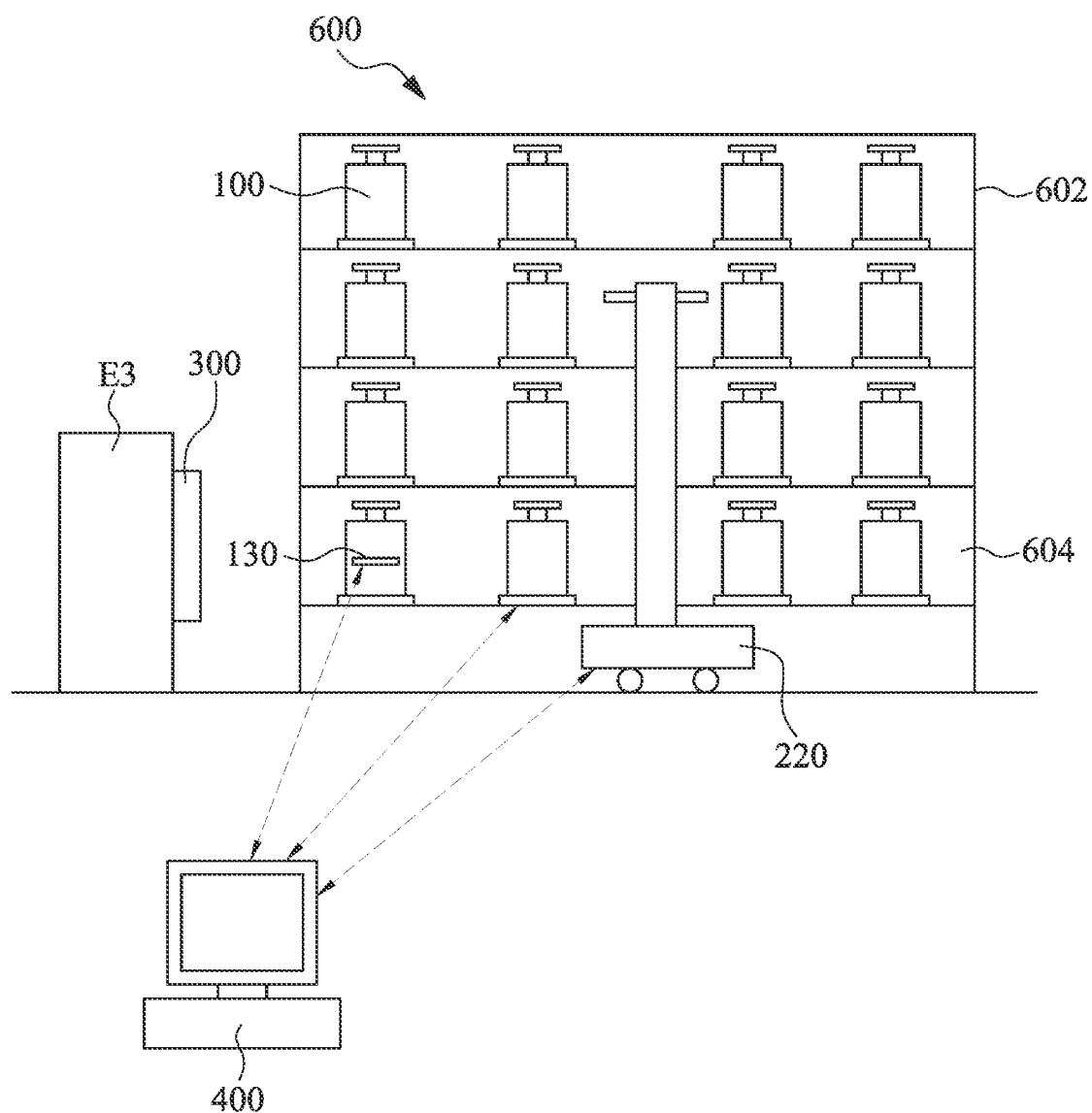
FIG. 7 is a schematic diagram illustrating a stocker, the identification module, and the control module of FIG. 1 in accordance with some embodiments of the present disclosure.

In some embodiments, the workpiece carrier 130 may include at least one storage condition sensor 135. More specifically, the storage condition sensor 135 is capable of detecting a storage condition (e.g., temperature, humidity, gas ingredient, and total organic carbon (TOC)) in the workpiece container 100 when the workpiece carrier 130 is positioned inside the workpiece container 100. For example, the storage condition sensor 135 may be a temperature sensor, a humidity sensor, a gas sensor, or combinations thereof. Subsequently, the storage condition sensor 135 may be communicated with the control module 400 (as shown in FIG. 7) of the workpiece storage system 10, e.g., in a wireless manner, so as to monitor the storage condition of the internal space 112 of the workpiece container 100. It is noted that the position of the storage condition sensor 135 in FIG. 3A is illustrative and not meant to limit the present disclosure. Embodiments fall within the present disclosure as long as the storage condition sensor 135 is arranged on the workpiece carrier 130. In some embodiments, the workpiece carrier 130 may further include an identification member, such as a barcode, a string of numbers/characters, and/or a radio frequency identification (RFID) component, to enable identification of the workpiece loaded thereon. In some embodiments, the identification member may be coordinated with the storage condition sensor 135 as a multifunctional component. That is, the identification member is combined with the storage condition sensor 135. In some other embodiments, the storage condition sensor 135 and the identification member are both positioned on the workpiece carrier 130 but at different positions.

Figure 4:
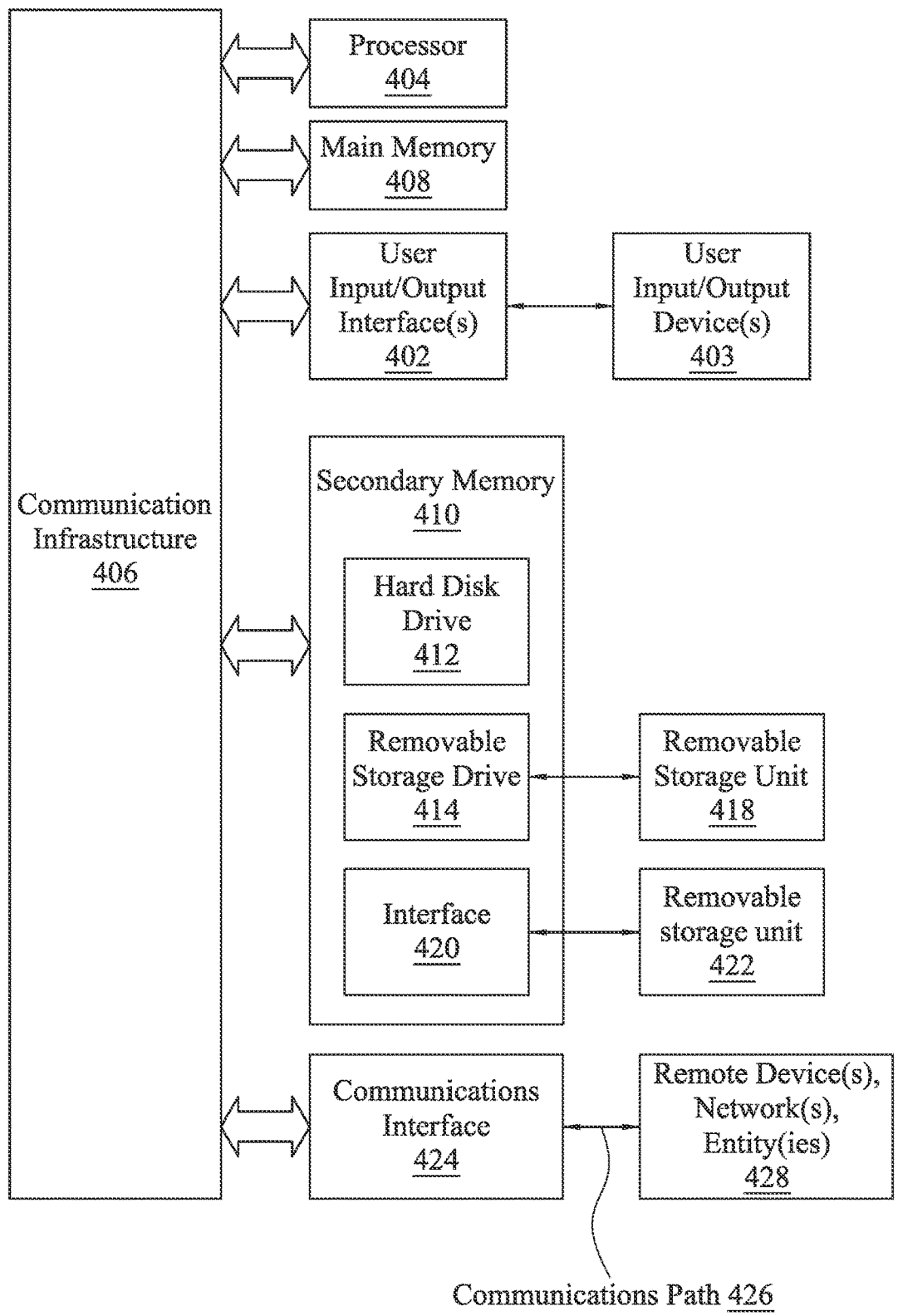
FIG. 4 is a schematic diagram illustrating a control module in accordance with some embodiments of the present disclosure.

Reference is made to FIG. 4, which a schematic diagram illustrating the control module 400 in accordance with some embodiments of the present disclosure. In some embodiments, the control module 400 may be also known as a computer system. As shown in FIG. 4, an illustration of an exemplary computer system in which various embodiments of the present disclosure can be implemented, according to some embodiments. The computer system may be used to control various components in the workpiece storage system 10 (as shown in FIG. 1). The computer system may be any well-known computer capable of performing functions and operations described in the present disclosure. For example, and without limitation, the computer system may be capable of processing and transmitting signals. The computer system may be used, for example, to execute one or more functions of the workpiece storage system 10, which describes example operations of communications amongst different components therein.

Figure 8:
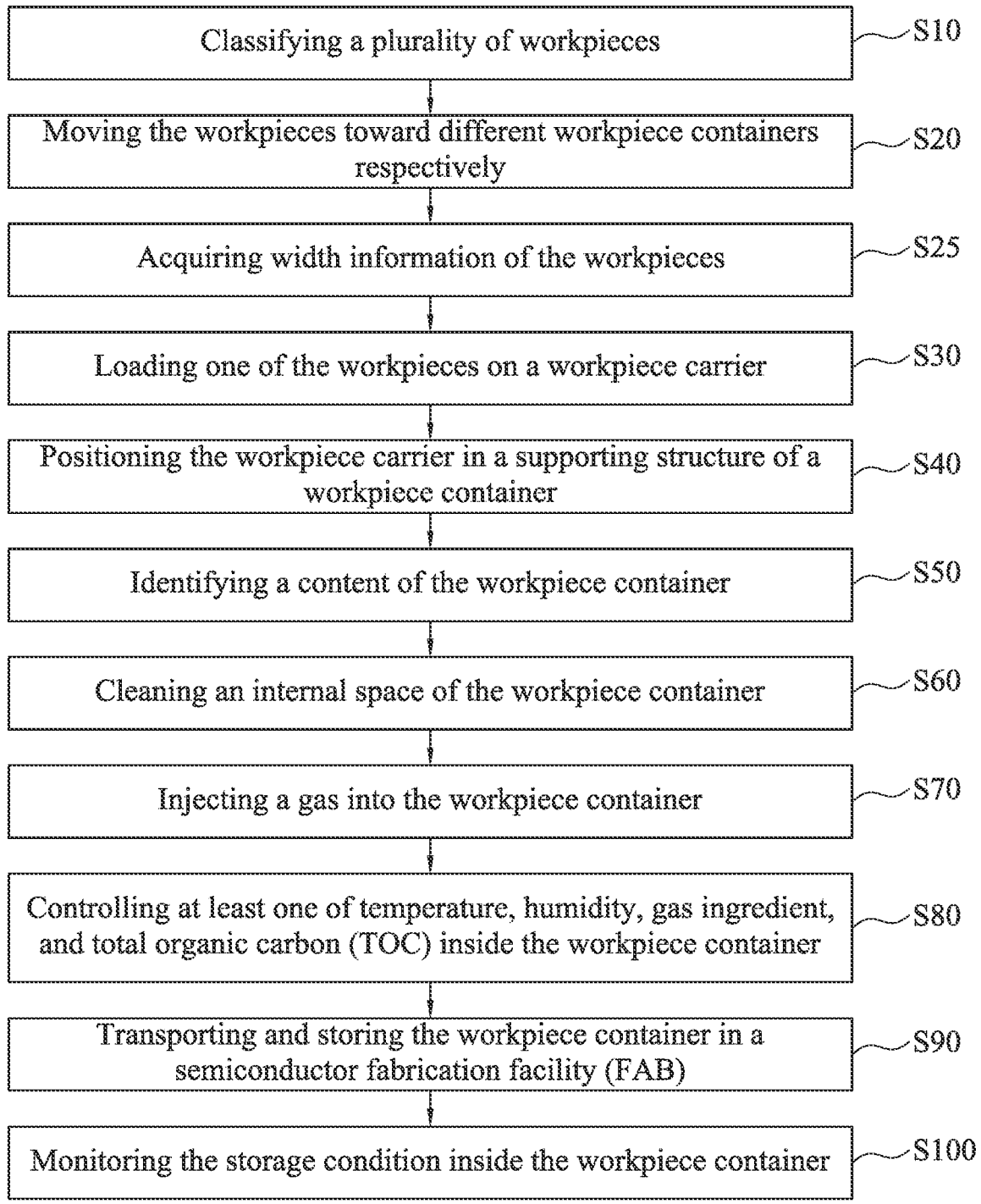
FIG. 8 is a flowchart illustrating a method for storing at least one workpiece in accordance with some embodiments of the present disclosure.

The computer system may include one or more processors (also called central processing units, or CPUs), such as a processor 404. The processor 404 is connected to a communication infrastructure or bus 406. The computer system also includes input/output device(s) 403, such as monitors, keyboards, and pointing devices, that may communicate with communication infrastructure or bus 406 through input/output interface(s) 402. The computer system may receive instructions to implement functions and operations described herein, e.g., functions of the workpiece storage system 10 and method M1 (as shown in FIG. 8), via the input/output device(s) 403. The computer system also includes a main or primary memory 408, such as random access memory (RAM). The main memory 408 may include one or more levels of cache. The main memory 408 has stored therein control logic (e.g., computer software) and/or data. In some embodiments, the control logic (e.g., computer software) and/or data may include one or more of the functions described with respect to the workpiece storage system 10.

The computer system may also include one or more secondary storage devices or memory 410. The secondary memory 410 may include, for example, a hard disk drive 412 and/or a removable storage device or drive 414. Removable storage drive 414 can be a floppy disk drive, a magnetic tape drive, a compact disk drive, an optical storage device, tape backup device, and/or any other storage device/drive.

The removable storage drive 414 may interact with a removable storage unit 418. The removable storage unit 418 includes a computer usable or readable storage device having stored thereon computer software (control logic) and/or data. The removable storage unit 418 may be a floppy disk, magnetic tape, compact disk, DVD, optical storage disk, and/any other computer data storage device. The removable storage drive 414 reads from and/or writes to removable storage unit 418 in a well-known manner.

In some embodiments, the secondary memory 410 may include other means, instrumentalities or other approaches for allowing computer programs and/or other instructions and/or data to be accessed by the computer system. Such means, instrumentalities or other approaches can include, for example, a removable storage unit 422 and an interface 420. Examples of the removable storage unit 422 and the interface 420 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, the secondary memory 410, the removable storage unit 418, and/or the removable storage unit 422 may include one or more of the functions described with respect to the workpiece storage system 10.

The computer system may further include a communication or network interface 424. The communication interface 424 enables the computer system to communicate and interact with any combination of remote devices, remote networks, remote entities, etc. (individually and collectively referenced by reference number 428). For example, the communication interface 424 may allow the computer system to communicate with the remote devices 428 over the communications path 426, which may be wired and/or wireless, and which may include any combination of LANs, WANs, the Internet, etc. Control logic and/or data may be transmitted to and from the computer system via the communication path 426.

The functions and/or operations in the preceding embodiments may be implemented in a wide variety of configurations and architectures. Therefore, some or all of the operations in the preceding embodiments, e.g., functions of the workpiece storage system 10 and method M1, may be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, the computer system, the main memory 408, the secondary memory 410, and the removable storage units 418 and 422, as well as tangible articles of manufacture embodying any combination of the foregoing. Such control logic, when executed by one or more data processing devices (such as the computer system), causes such data processing devices to operate as described in the present disclosure. In some embodiments, the computer system includes hardware/equipment for the manufacturing of photomasks and circuit fabrication. For example, the hardware/equipment may be connected to or be part of the element 428 (remote device(s), network(s), entity(ies)) of the computer system.

Reference is made to FIG. 5, which is a schematic diagram illustrating the workpiece containers 100, the transport module 200, the identification module 300, and the control module 400 of FIG. 1 in accordance with some embodiments of the present disclosure. It is noted that, the FAB may include one or more floors on which a plurality of processing bays are positioned, and further, a processing bay may include various processing tools and/or wafer storing equipment. In order to interconnect the various processing tools, wafer storing equipment, processing bays, and other facilities in the FAB, the transport module 200 is installed. More specifically, the transport module 200 may include various types of automated and manual vehicles for moving and transporting a plurality of workpieces throughout the FAB during semiconductor manufacturing processes.

In some embodiments, the transport module 200 is an automated material handling system (AMHS) that may include at least one of overhead hoist transfer (OHT), overhead shuttle (OHS), rail guided vehicle (RGV), automated guided vehicle (AGV), personal guided vehicle (PGV), or combinations thereof. Consequently, a plurality of workpiece containers 100 may be controllably and fluently transported between various processing tools, stockers, and processing bays to facilitate manufacturing of semiconductor products. That is, due to the configuration of the transport module 200, inter-bay connection and/or intra-bay connection may be achieved.

In some embodiments, as shown in FIG. 5, the transport module 200 may include an overhead hoist transfer (OHT) 201, and the FAB may further include a processing tool E1 and a staging equipment E2 (or a relay station). More detailed descriptions about these components will be sequentially presented as follows.

In some embodiments, the OHT 201 may include a rail 202 and one or more OHT vehicles 204 that are movable on the rail 202. The rail 202 is operable to support and guide movement of the one or more OHT vehicles 204. For example, the one or more OHT vehicles 204 may be suspended from the rail 202 and transported thereon. In some embodiments, the rail 202 may include a monorail affixed to and suspended from the ceiling of the FAB. On the other hand, the OHT vehicle 204 may carry and transport the workpiece container 100 within each processing bay (i.e., the intra-bay movement) or between different processing bays (i.e., the inter-bay movement). In some embodiments, each OHT vehicle 204 may hold one workpiece container 100 at a time and transport the workpiece container 100 along a substantially horizontal direction (as represented by the solid horizontal double-head arrow in FIG. 5). Additionally, the OHT vehicle 204 may include one or more gripper arm 206 and a gripper 208. The gripper arm 206 may be extendable and retractable from the OHT vehicle 204 to reach a workpiece container 100 therebelow. The gripper 208 may be coupled to an end of the gripper arm 206 for grasping the robotic flange 140 of the workpiece container 100. Consequently, the workpiece container 100 may be picked up, held, raised, lowered, and/or released by the OHT vehicle 204 at a load port of equipment, e.g., the processing tool E1 and/or the staging equipment E2.

For example, as shown in FIG. 5, the OHT 201 may grasp a workpiece container 100 by the gripper 208 of the OHT vehicle 204 at the load port of the processing tool E1.

Subsequently, the workpiece container 100 may be raised by the gripper arm 206 of the OHT vehicle 204, held by the OHT vehicle 204, and transported through the rail 202. After being transported, the workpiece container 100 may be unloaded at the load port of the staging equipment E2. It is noted that transportation of the workpiece container 100 is not limited to the aforementioned embodiments, e.g., the workpiece container 100 may be transported between various processing tools, stockers, staging equipment, or other possible manufacturing devices in the FAB.

As shown in FIG. 5, the identification module 300 may be coordinated with the processing tool E1 and configured to identify a content of the workpiece container 100. More specifically, the identification module 300 may detect the workpiece container 100 by means of optical mark recognition (OMR), radio frequency identification (RFID), or a combination thereof.

In some embodiments, the identification module 300 that utilizes the optical mark recognition technique may include an optic inspection instrument, such as a scanner, that may project a radiation onto an object and analyze the reflected radiation from the object. For example, the identification module 300 may scan an identification area (e.g., a barcode, a pattern, combinations thereof, or the like, may be arranged therein) which may be imprinted on the workpiece container 100 so as to acquire information about the contained workpiece therein. It is noted that scanning of the identification module 300 is not limited by the aforementioned embodiments, e.g., the identification module 300 may directly scan the workpiece carrier 130 and/or a workpiece thereon.

In some other embodiments, the identification module 300 that utilizes the radio frequency identification (RFID) technique may include a sensor and/or an antenna that may interact with a RFID tag on the workpiece container 100 and manage information stored in the RFID tag. The RFID tag may contain a variety of information, such as content and/or processing instruction of the workpiece container 100. Further, when the workpiece container 100 is positioned at the load port of the processing tool E1, the identification module 300 may read and/or write information in the RFID tag attached thereon, so as to facilitate the semiconductor manufacturing processes. In some embodiments, the RFID technique may be applied to the workpieces, the workpiece carrier 130, and/or the workpiece container 100, such that data transmission of the workpiece storage system 10 may be further improved.

In some embodiments, the identification module 300 is communicated with the control module 400. The control module 400 may include computer-supported equipment that is capable of manipulating the semiconductor manufacturing processes. For example, after receiving information from the identification module 300, the control module 400 may analyze the information to accordingly determine and proceed with subsequent manufacturing processes (e.g., transport destination of the workpiece container 100 may be determined). Additionally, in some embodiments, the control module 400 may have a graphical user interface (GUI) that may enable contact control, for example, by a FAB employee.

Figure 6:
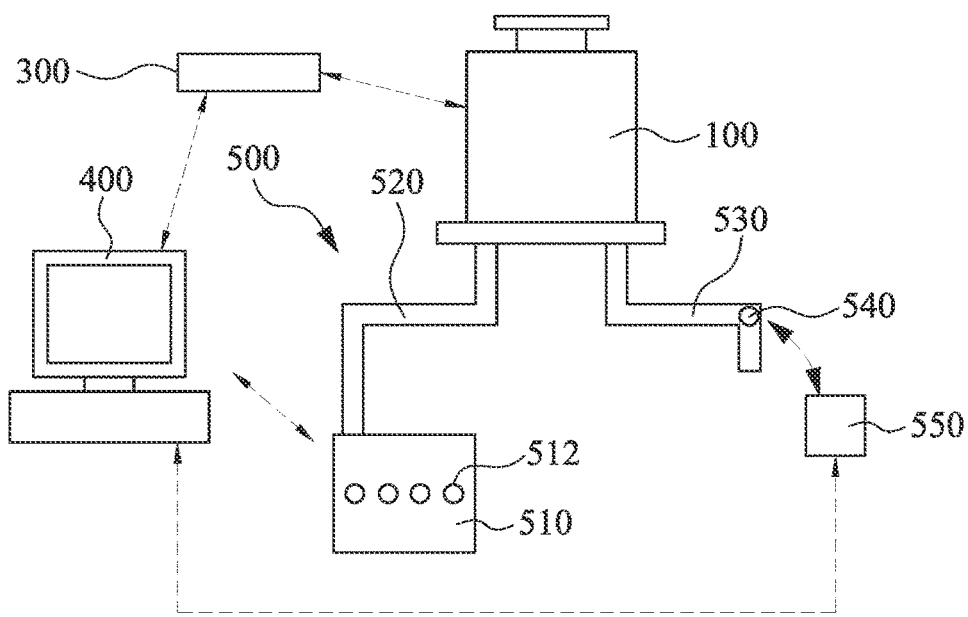
FIG. 6 is a schematic diagram illustrating a gas distribution module, the identification module, and the control module in FIG. 1 in accordance with some embodiments of the present disclosure.

Reference is made to FIG. 6, which is a schematic diagram illustrating the gas distribution module 500, the identification module 300, and the control module 400 in FIG. 1 in accordance with some embodiments of the present disclosure. More specifically, the gas distribution module 500 may include a pair of distribution ducts, a gas supply device 510, and a sensor 540. Further, after the identification module 300 identifies the workpiece container 100 at the processing tool E1 (as shown in FIG. 5) or near the gas distribution module 500, the control module 400 may acquire information about the workpiece container 100. Subsequently, the gas distribution module 500 may adjust a storage condition of the workpiece container 100 based on the information from the control module 400.

In some embodiments, the pair of distribution ducts includes a supply pipe 520 and an exhaust pipe 530 that are coupled to the gas inlet 116 and the gas outlet 118 of the workpiece container 100 (as shown in FIG. 2) respectively. Hence, a gas input path may be substantially separated from a gas output path, so as to facilitate adjustment of the storage condition. For example, the workpiece container 100 is positioned such that the gas inlet 116 of the workpiece container 100 is coupled to the supply pipe 520 and the gas outlet 118 of the workpiece container 100 is coupled to the exhaust pipe 530, thus allowing the gas distribution module 500 to perform the storage condition control of the workpiece container 100 through the gas inlet 116 and the gas outlet 118.

In some embodiments, the gas supply device 510 is connected to the workpiece container 100 by the supply pipe 520, so as to clean the internal space 112 of the workpiece container 100 and/or adjust the storage condition therein (e.g., temperature, humidity, gas ingredient, and total organic carbon (TOC)) by injecting a gas. Additionally, the gas supply device 510 may include a variety of indicators that may show parameters and/or kinds of the gas injected into the workpiece container 100. For example, as show in FIG. 6, the gas supply device 510 has a plurality of indicator lights 512 that may represent a variety of gases respectively, such as nitrogen ($N_2$) and ultra clean dry air (XCDA).

In some embodiments, the sensor 540 is positioned in the exhaust pipe 530, so as to detect the storage condition (e.g., temperature, humidity, gas ingredient, and total organic carbon (TOC)) inside the workpiece container 100 through a gas outflowing therefrom and/or check whether a gas leak issue happens to the workpiece container 100. In some embodiments, the sensor 540 may be coupled to a processor 550 that is adjacent to the sensor 540 and interconnects with the control module 400. The processor 550 may analyze information from the sensor 540 and output an analyzation result to the control module 400 to facilitate subsequent reactions (e.g., adjusting the storage condition of the workpiece container 100). In some embodiments, the processor 550 may be equipped with a screen displaying the analyzation result thereon, such that observation of the analyzation result may be more convenient. In some embodiments, the processor 550 may raise an alarm through any suitable means when the analyzation result shows that the storage condition of the workpiece container 100 is not suitable or the gas leak issue happens to the workpiece container 100. In some other embodiments, the sensor 540 may directly interconnect with the control module 400, and the processor 550 may be omitted.

In some embodiments, the control module 400 may selectively interconnect with the workpiece container 100, the storage condition sensor 135 of the workpiece carrier 130 (as shown in FIG. 3A), the identification module 300, the gas supply device 510, and/or the processor 550. Hence, the storage condition of the internal space 112 of the workpiece container 100 may be appropriately adjusted and maintained under close surveillance.

Reference is made to FIG. 7, which is a schematic diagram illustrating a stocker 600, the identification module 300, and the control module 400 of FIG. 1 in accordance with some embodiments of the present disclosure. More specifically, the stocker 600 may include a housing 602 that has multiple storage shelves (or bins) 604 for temporarily storing a plurality of workpiece containers 100. In some embodiments, a load port E3 may be positioned adjacent to the stocker 600 as a relay station. Additionally, a robotic crane 220 of the transport module 200 may be configured near the stocker 600, so as to make the workpiece container 100 positioned into and/or retrieved from the stocker 600. In some embodiments, the control module 400 may interconnect with the robotic crane 220 and the stocker 600, such that positioning of the workpiece containers 100 may be well-organized. In some embodiments, the identification module 300 may be configured near the load port E3 and/or the stocker 600. The identification module 300 may double-check whether the workpiece container 100 is correctly transported to the designated stocker 600 or whether the workpiece(s) is correctly classified and positioned into the workpiece container 100.

Since the workpiece container 100 of the present disclosure may retain different types of workpieces therein at the same time, there would be no need to install various types of stockers in the FAB. Additionally, the workpiece container 100 may also provide independent storage environments to the different types of workpieces respectively. Consequently, relevant workpieces (e.g., wafer and photomask) of a semiconductor manufacturing process may be stored together in a stocker adjacent to a corresponding processing tool.

Reference is made to FIG. 8, which is a flowchart illustrating a method M1 for storing at least one workpiece in accordance with some embodiments of the present disclosure. For illustration purposes, the workpiece storage system 10 mentioned above is referenced to collectively describe the details of the method. It is noted that each of the methods presented below is merely an example, and not intended to limit the present disclosure beyond what is explicitly recited in the claims. Additional operations may be provided before, during, and after each of the methods. Some operations described may be replaced, eliminated, or moved around for additional embodiments of the fabrication process. Additionally, for clarity and ease of explanation, some elements of the figures have been simplified.

The operation S10 includes classifying a plurality of workpieces. More specifically, the workpiece may include wafer, wafer box, wafer pod, photomask box, photomask pod, standard mechanical interface (SMIF) device, combinations thereof, or the like. Further, the workpiece may also include finished product and/or semi-finished product of semiconductor devices. In some embodiments, a plurality of workpieces may be identified and classified into multiple groups according to a variety of characters (e.g., storage condition) through the identification module 300 and the control module 400, so as to improve the storage of the workpieces. For example, some workpieces (such as the wafer S1, the wafer pod S2, and the photomask box S3 in FIG. 2) may be stored in the same condition/environment, these three workpieces may be classified as a group by the identification module 300 and the control module 400. In the meantime, some other workpieces may be classified as another group by the identification module 300 and the control module 400 if they can be stored in another same condition/environment.

The operation S20 includes moving the workpieces toward different workpiece containers 100 respectively. More specifically, after being classified, the control module 400 may provide a command. The transport module 200 may receive the command and respectively moves the multiple groups of the workpieces toward corresponding workpiece containers 100. For example, according to respective storage conditions, a workpiece may be moved toward a workpiece container 100 while another workpiece may be moved toward another workpiece container 100, such that suitable storage conditions may be separately provided to the workpiece containers 100 through the following operations. For example, the wafer S1, the wafer pod S2, and the photomask box S3 in FIG. 2 may be moved to the same workpiece container 100. In some embodiments, the various workpieces may be identified and/or classified at different positions in the FAB (e.g., the processing tool E1, the staging equipment E2, or the load port E3). Subsequently, the workpieces at different positions may be transported toward corresponding workpiece containers 100 to facilitate the following operations.

After the workpieces are moved to be adjacent to corresponding workpiece containers 100, at least one of the workpieces may be positioned in the supporting structure 120 of the workpiece container 100 either directly or through the workpiece carrier 130. More detailed descriptions about positioning of the workpieces are presented as follows.

The operation S25 includes acquiring width information of the workpieces. More specifically, as shown in FIG. 2, the supporting structure 120 may have opposite portions located on opposite inner sidewalls of the housing 110, and a horizontal distance between the opposite portions of the supporting structure 120 may be denoted as D. In some embodiments, when some workpieces (such as wafer pod S2 and the photomask box S3) have widths W2 and W3 less than the distance D, these workpieces are unable to be supported directly by the supporting structure 120. However, these workpieces may be loaded on the workpiece carrier 130, which is able to be supported by the supporting structure 120. In some other embodiments, when a workpiece (such as the wafer S1) has a width W1 greater than the distance D, the workpiece may be directly supported by the supporting structure 120. In this operation, the control module 400 may acquire the width information of the workpieces (e.g., from the identification data of the workpieces). If the width of the workpiece is less than the distance D, the workpiece will be loaded on the workpiece carrier 130. Conversely, if the width of the workpiece is greater than the distance D, the workpiece may be directly loaded on the supporting structure 120, or the workpiece may be also loaded on the supporting structure 120 through the workpiece carrier 130.

The operation S30 includes loading one of the workpieces on one workpiece carrier 130. More specifically, as described above, the workpiece (such as the wafer pod S2 and the photomask box S3) which has a width less than the distance D may be loaded on the workpiece carrier 130 before being positioned on the supporting structure 120. The workpiece carrier 130 may have a plurality of structural configurations, such as the platform 132, the hollow 1322, and the opening 1324. The gripper 208 of the overhead hoist transfer (OHT) 201 as shown in FIG. 5 may pass through the hollow 1322 to load one workpiece on the platform 132 along a vertical direction. Additionally, an arm of the transport module 200 (e.g., a rail guided vehicle (RGV), an automated guided vehicle (AGV), or the like) may also pass through the hollow 1322 and the opening 1324 to load one workpiece on the platform 132 along vertical and horizontal directions.

Further, when one workpiece (e.g., the wafer pod S2 and the photomask box S3) is loaded on the workpiece carrier 130, the pressed pins 136 may be downwardly moved to make the workpiece descend simultaneously while the other pins 136 that remain at their initial positions may collectively act as a fence to surround sides of the workpiece. Consequently, the workpiece may be stably positioned on the workpiece carrier 130.

The operation S40 includes positioning the workpiece carrier 130 in the supporting structure 120 of the workpiece container 100, e.g., based on a height of the workpiece. More specifically, the identification module 300 may identify a type of the workpiece (e.g., the wafer S1, the wafer pod S2, and the photomask box S3 as shown in FIG. 2) by various means mentioned above and also acquire information about the height of the workpiece. For example, the wafer S1 may be identified and measured to have a height T1. For another example, the wafer pod S2 may be identified, and further, the wafer pod S2 and the workpiece carrier 130 may be measured to have a height T2. For yet another example, the photomask box S3 may be identified, and further, the photomask box S3 and the workpiece carrier 130 may be measured to have a height T3.

In some embodiments, the identification module 300 and the control module 400 may subsequently cooperate to determine where the workpiece should be disposed in the workpiece container 100. More specifically, according to the height of the workpiece (e.g., the heights T1, T2, and T3), the control module 400 may calculate how many floors in the supporting structure 120 of the workpiece container 100 are required for providing sufficient space to the workpiece. Further, the control module 400 may determine respective disposing positions of multiple workpieces. In some embodiments, if the wafer S1, the wafer pod S2, and the photomask box S3 as shown in FIG. 2 require substantially the same storage condition, these workpieces may be disposed in the supporting structure 120 in any sequence thereof. For example, when the photomask box S3 on the workpiece carrier 130 has been disposed in one floor of the supporting structure 120, the wafer pod S2 on the workpiece carrier 130 may be determined to be disposed in another floor of the supporting structure 120 which is spaced apart from the floor for supporting the photomask box S3 on the workpiece carrier 130 by a distance greater than the height T3. Further, the wafer S1 may be determined to be disposed in yet another floor of the supporting structure 120 which is spaced apart from the floor for supporting the wafer pod S2 on the workpiece carrier 130 by a distance greater than the height T2. Therefore, collision of the wafer S1, the wafer pod S2, the photomask box S3, and the workpiece carriers 130 may be prevented.

Consequently, various workpieces with different widths and heights may be disposed in the supporting structure 120 together, so as to achieve the adaptable storage of the various workpieces described below.

The operation S50 includes identifying the content of the workpiece container 100. More specifically, after various workpieces are positioned in the workpiece container 100, the workpiece container 100 may be sealed to make the interior thereof isolated from its surrounding environment. The workpiece container 100 is then transported to and loaded on the gas distribution module 500 by the transport module 200. Further, the identification module 300 may detect the workpiece container 100 by means of optical mark recognition (OMR), radio frequency identification (RFID), combinations thereof, or the like. Consequently, a variety of information about the detected workpiece container 100, such as the content therein, may be acquired and analyzed by the control module 400 to facilitate the following operations.

The operation S60 includes cleaning the internal space 112 of the workpiece container 100. More specifically, before adjusting the storage condition of the internal space 112, the gas distribution module 500 may clean up the internal space 112 through providing a gas flow thereinto, such that contamination (e.g., unwanted substance and/or gas) in the internal space 112 may be substantially removed. Consequently, it may be assured that the storage condition of the internal space 112 remains clean and appropriate for the following operations. It is noted that the operation S60 may be selectively performed based on various designs. For example, in some embodiments, if the internal space 112 of the workpiece container 100 is already clean enough, the operation S60 may be omitted so as to expedite the semiconductor manufacturing processes.

The operation S70 includes injecting a gas into the workpiece container 100 according to the identified content. More specifically, according to the content of the workpiece container 100 acquired by the identification module 300, the control module 400 may inform the gas distribution module 500, such that the gas supply device 510 of the gas distribution module 500 may provide the internal space 112 of the workpiece container 100 with appropriate gas(es). Further, the storage environment of various workpieces (e.g., different types of wafers, wafer box, wafer pod, photomask box, photomask pod, standard mechanical interface (SMIF) device, combinations thereof, or the like) that have substantially the same demand for their storage condition may be correspondingly adjusted. In some embodiments, the appropriate gas may include nitrogen ($N_2$), ultra clean dry air (XCDA), other suitable gases, or the like. Consequently, the storage quality of the workpieces may be improved.

In some embodiments, during injecting the gas into the workpiece container 100, both the supply pipe 520 and the exhaust pipe 530 are open, such that the original gas in the internal space 112 may be gradually pushed out by the injected gas. Further, the sensor 540 in the exhaust pipe 530 may detect whether the internal space 112 is completely adjusted through the discharged gas. In some other embodiments, after the internal space 112 is purged, the internal space 112 may be vacuumed and subsequently provided with appropriate gas(es) to adjust the storage condition therein.

The operation S80 includes controlling at least one of temperature, humidity, gas ingredient, and total organic carbon (TOC) inside the workpiece container 100. More specifically, through injecting the gas into the workpiece container 100, a variety of factors (e.g., temperature, humidity, gas ingredient, and total organic carbon (TOC)) pertaining to the storage condition of the internal space 112 may be deliberately and separately controlled. For example, in order to heat up the storage condition in the workpiece container 100, the gas supply device 510 may provide a gas with high temperature thereto. For another example, in order to increase the humidity of the storage condition in the workpiece container 100, the gas supply device 510 may provide a specific amount of water vapor thereto. Further, the control module 400 may analyze information from the sensor 540, the processor 550, and/or the storage condition sensor 135 of the workpiece carrier 130, such that the gas distribution module 500 interconnected with the control module 400 may be driven to control and fine-tune the various factors mentioned above.

After the storage condition of the internal space 112 of the workpiece container 100 is appropriately adjusted, the workpiece container 100 may be sealed, so as to make the interior thereof isolated from its surrounding environment. Subsequently, in some embodiments, the control module 400 and the gas distribution module 500 may collectively detect whether a gas leak issue happens to the workpiece container 100 through the function of the sensor 540, the processor 550, and/or the storage condition sensor 135 of the workpiece carrier 130. For example, after the workpiece container 100 is sealed, the sensor 540 may detect whether a discharged gas occur in the exhaust pipe 530. For another example, the storage condition sensor 135 of the workpiece carrier 130 may detect whether a pressure of the internal space 112 becomes lower. For yet another example, the storage condition sensor 135 of the workpiece carrier 130 may detect whether a gas ingredient inside the internal space 112 changes or not. Additionally, in some embodiments, if occurrence of the gas leak issue is confirmed by the control module 400, the control module 400 may restart either one of the operations S60 and S70 mentioned above, so as to ensure that the storage condition inside the workpiece container 100 is appropriately adjusted and maintained.

The operation S90 includes transporting and storing the workpiece container 100 in a semiconductor fabrication facility (FAB). More specifically, a plurality of sealed workpiece containers 100 may be respectively moved by the transport module 200 to their designated positions in the FAB (e.g., processing tools E1, staging equipment E2, and stocker 600) based on various designs. In some embodiments, as shown in FIG. 7, a workpiece container 100 may be transported to the stocker 600 and stored therein. In some other embodiments, a workpiece container 100 may be transported and stored in a stocker 600 close to a processing tool that may perform the next manufacturing process of a workpiece in the workpiece container 100. Consequently, the workpiece storage system 10 may efficiently manage transport and storage of various workpieces. In this way, fewer stockers 600 can be disposed in the FAB, and each of the stockers 600 can store different types of the workpieces. As such, the storage space of the stocker 600 can be efficiently used.

The operation S100 includes monitoring the storage condition inside the workpiece container 100. More specifically, the control module 400 may surveil the internal space 112 of the workpiece container 100 with respect to various factors (e.g., temperature, humidity, gas ingredient, total organic carbon (TOC), or combinations thereof) through the storage condition sensor 135 of the workpiece carrier 130 and/or other sensor(s) of the workpiece container 100. Consequently, it may be ensured that the storage condition inside the workpiece container 100 is appropriately maintained. It is noted that the function timing of the operation S100 is not intended to be limiting. For example, the operation S100 may be performed at any timing after the workpiece container 100 is sealed.

Figure 9:
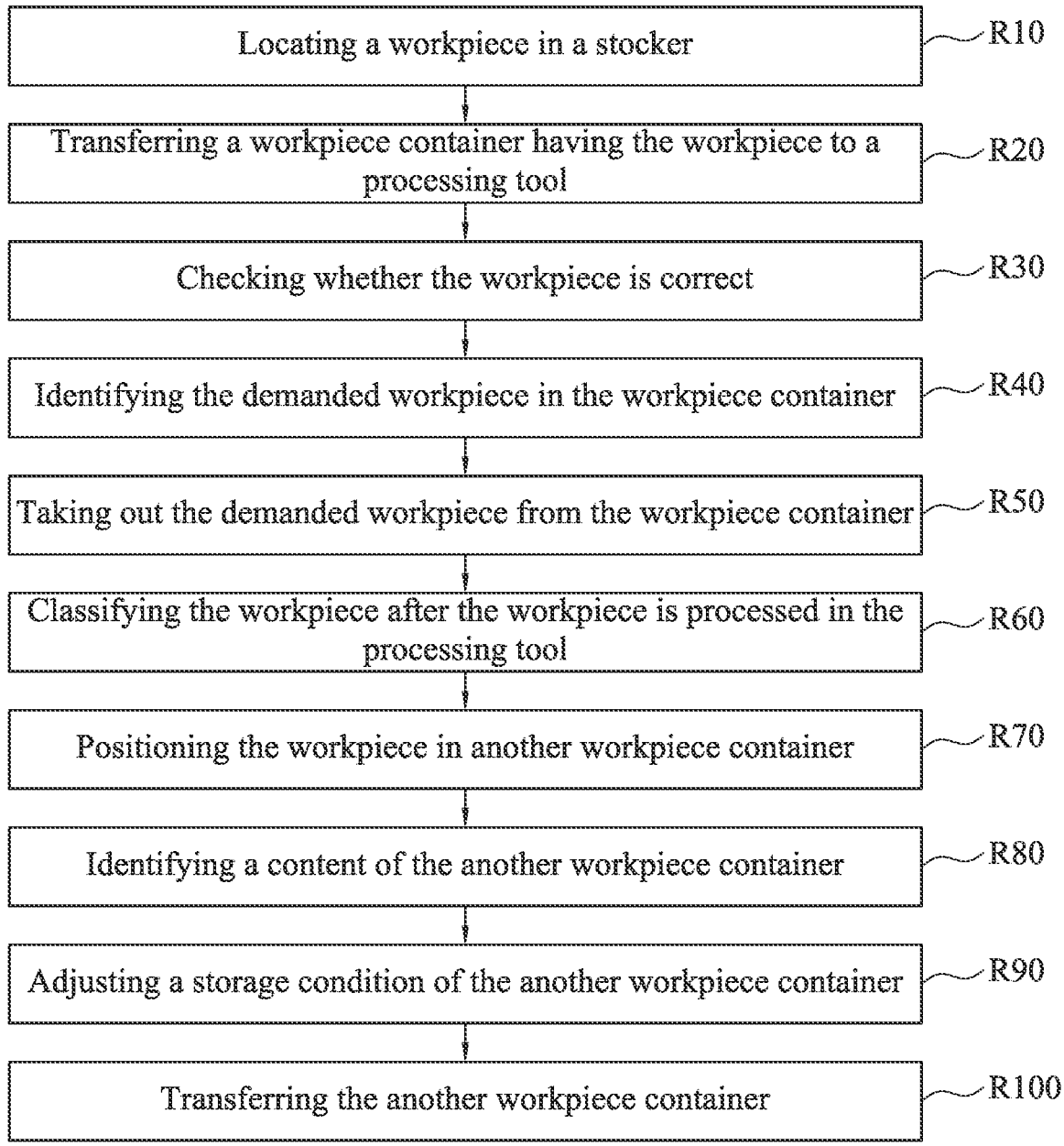
FIG. 9 is a flowchart illustrating a method for processing at least one workpiece in accordance with some embodiments of the present disclosure.

Reference is made to FIG. 9, which is a flowchart illustrating a method M2 for processing at least one workpiece in accordance with some embodiments of the present disclosure. For illustration purposes, the workpiece storage system 10 mentioned above is referenced to collectively describe the details of the method. It is noted that each of the methods presented below is merely an example, and not intended to limit the present disclosure beyond what is explicitly recited in the claims. Additional operations may be provided before, during, and after each of the methods. Some operations described may be replaced, eliminated, or moved around for additional embodiments of the fabrication process. Additionally, for clarity and ease of explanation, some elements of the figures have been simplified.

The operation R10 includes locating a workpiece in FAB, e.g., in the stocker 600. More specifically, when a demand for the workpiece is provided, the control module 400 may search for the location of the workpiece (e.g., in the workpiece container 100 within the stocker 600). In some embodiments, through interconnect between the identification module 300 and the workpiece carrier 130 (or the workpiece thereon), the control module 400 may find out the location of the workpiece. In some embodiments, during the identification of the workpiece, the workpiece container 100 that contains the workpiece may remain sealed, such that the storage condition of the workpiece may be maintained.

The operation R20 includes transferring a workpiece container 100 containing the workpiece. More specifically, after the location of the workpiece is checked, the transport module 200 may take out the workpiece container 100 that contains the wanted workpiece from the stocker 600. Subsequently, the workpiece container 100 may be transferred to a designated location in the FAB (e.g., the processing tool E1) for the following manufacturing process.

The operation R30 includes checking whether the workpiece is correct. More specifically, when the workpiece container 100 is transferred to the processing tool E1, the identification module 300 adjacent to the processing tool E1 would double-check whether the workpiece meets the demand or not. Further, when the workpiece is correct (i.e., the workpiece in the workpiece container 100 meets the demand), the control module 400 may proceed with the following manufacturing process. Conversely, when the workpiece is incorrect (i.e., the workpiece in the workpiece container 100 does not meets the demand), the control module 400 may return the workpiece back to its original location (e.g., the workpiece container 100 may be transported back to the stocker 600) or a designated location in the FAB, and then, restart the operation R10.

The operation R40 includes identifying the demanded workpiece in the workpiece container 100. In some embodiments, when a plurality of workpieces (e.g., the wafer S1, the wafer pod S2, and the photomask box S3 as shown in FIG. 2) are stored in the workpiece container 100, the identification module 300 may find out the demanded workpiece by identifying the workpiece itself and/or the workpiece carrier 130.

The operation R50 includes taking out the demanded workpiece from the workpiece container 100. More specifically, after the demanded workpiece is identified, the transport module 200 may take out the demanded workpiece itself and/or the workpiece carrier 130 that holds the demanded workpiece. For example, when the wafer S1 is demanded, the transport module 200 may directly take the wafer S1 out of the workpiece container 100. For another example, when the wafer pod S2 and/or the photomask box S3 is demanded, the transport module 200 may move the workpiece carrier 130 that holds the wafer pod S2 and/or the photomask box S3 out of the workpiece container 100, and then, unload the wafer pod S2 and/or the photomask box S3 from the workpiece carrier 130. Further, the arm, the gripper 208, and other components of the transport module 200 described above may be selectively used to perform the operation R50.

Additionally, after the demanded workpiece is taken out of the workpiece container 100, the workpiece container 100 may be transferred to the gas distribution module 500 for adjusting the storage condition therein. Similarly, the identification module 300 may identify the content of the workpiece container 100. Subsequently, the gas distribution module 500 may adjust the storage condition inside the workpiece container 100 based on the content therein. In some embodiments, since a workpiece ingredient in the workpiece container 100 changes, the gas distribution module 500 may provide the remained workpieces with a more suitable storage condition, such that the remained workpieces in the workpiece container 100 may be stored in a suitable storage condition accordingly.

The operation R60 includes classifying the workpiece after the workpiece is processed in the processing tool E1. More specifically, after the demanded workpiece is taken out of the workpiece container 100, the demanded workpiece may be utilized in the processing tool E1. For example, after the photomask box S3 is taken out, the photomask therein may be moved and installed on a photomask holder of an exposure apparatus. In another example, after the wafer S1 is taken out, the wafer S1 may be moved and processed in the processing tool E1. After the workpiece is utilized in the processing tool E1, the processed workpiece may be identified and classified according to a variety of characters (e.g., suitable storage condition) through the identification module 300 and the control module 400.

The operation R70 includes positioning the workpiece in a workpiece container 100. In some embodiments, if the processed workpiece is desired to be stored in substantially the same storage condition as before, the processed workpiece may be positioned into the original workpiece container 100. In some embodiments, if the processed workpiece requires a storage condition different from before, the processed workpiece may be positioned into another workpiece container 100.

It is noted that since the operations R80, R90, R100 of the method M2 as shown in FIG. 9 are similar to the operations S50, S80, S90 of method M1 as shown in FIG. 8, descriptions for those similar operations will not be repeated hereinafter. Through the method M2 described above, a wanted workpiece may be transported from a stocker (or relay station) to a designated position, and further, appropriately stored after at least one manufacturing process is conducted thereto.

Based on the above-mentioned descriptions, various advantages may be provided by the present disclosure. In detail, an all-in-one workpiece container that has a supporting structure and at least one workpiece carrier is provided to contain a variety of workpieces (e.g., wafer, wafer box, wafer pod, photomask box, photomask pod, standard mechanical interface (SMIF) device, finished product, and unfinished product) therein. Further, a plurality of elongated bars are configured on a top surface of the workpiece carrier to collectively form a flat virtual plane that is adaptable to the various workpieces with different shapes. After the various workpieces are positioned in the all-in-one workpiece container, the content of the workpiece container may be identified, and subsequently, the storage condition of the workpiece container may be adjusted and maintained according to the content therein. Additionally, the storage condition of the workpiece container may be monitored to ensure that the storage condition is appropriately adjusted and maintained. Consequently, the various workpieces may be respectively grouped based on their demands for different storage conditions and then stored in the corresponding storage conditions, such that the storage quality of the various workpieces may be improved and the risk of mutual contamination between various workpieces may be decreased.

In some embodiments, a method for storage a workpiece used in fabrication of a semiconductor device includes disposing the workpiece on a workpiece carrier, disposing the workpiece carrier with the workpiece in a workpiece container via a workpiece storage system, identifying a content of the workpiece container, and adjusting a storage condition inside the workpiece container in response to the content of the workpiece container via the workpiece storage system.

In some embodiments, a method for transferring a workpiece used in fabrication of a semiconductor device includes providing a demand of using the workpiece via a workpiece storage system, locating a workpiece container containing the workpiece, transferring the workpiece container to a processing tool, taking out a workpiece carrier that holds the workpiece from the workpiece container via the workpiece storage system, and processing the workpiece through the processing tool.

In some embodiments, a workpiece storage system includes a workpiece container, a transport module, an identification module, a gas distribution module, and a control module. The workpiece container has an internal space for storing at least one workpiece. The transport module is configured to transport the workpiece container in a semiconductor fabrication facility (FAB). The identification module is configured to identify a content of the workpiece container. The gas distribution module is configured to adjust a storage condition of the internal space of the workpiece container. The control module is connected to the transport module, the identification module, and the gas distribution module, and configured to coordinate functions of the transport module, the identification module, and the gas distribution module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    disposing, by using a transport module of a workpiece storage system, a first workpiece on a first workpiece carrier;
    disposing, by using the transport module, the first workpiece carrier with the first workpiece in a workpiece container;
    disposing, by using the transport module, a second workpiece in the workpiece container, wherein the first workpiece and the second workpiece have different sizes; and
    transferring, by using the transport module, the workpiece container containing the second workpiece and the first workpiece carrier with the first workpiece to a stocker to store the workpiece container.

2. The method of claim 1, wherein the second workpiece is a wafer.

3. The method of claim 1, wherein the first workpiece is a wafer box, a wafer pod, a photomask box, a photomask pod, or a standard mechanical interface (SMIF) device.

4. The method of claim 1, further comprising:
disposing, by using the transport module, the second workpiece on a second workpiece carrier prior to disposing the second workpiece in the workpiece container.

5. The method of claim 1, wherein the workpiece container comprises a pair of supporting structures configured to support the first workpiece carrier, an a lateral spacing between the pair of supporting structures is greater than a width of the first workpiece.

6. The method of claim 1, further comprising:
adjusting a storage condition inside the workpiece container in response to the first workpiece and the second workpiece via the workpiece storage system.

7. The method of claim 6, wherein adjusting the storage condition comprises:
injecting a gas into the workpiece container; and
controlling at least one of temperature, humidity, gas ingredient, and total organic carbon (TOC) inside the workpiece container by the gas.

8. A method comprising:
disposing, by using a transport module of a workpiece storage system, a workpiece on a workpiece carrier;
disposing, by using the transport module, the workpiece carrier with the workpiece in a workpiece container, wherein the workpiece carrier is supported by one pair of supporting structures of the workpiece container, and a vertical thickness of the workpiece is greater than a distance between adjacent two floors of the supporting structures; and
after disposing the workpiece carrier with the workpiece in the workpiece container, sealing the workpiece container.

9. The method of claim 8, wherein a width of the workpiece is smaller than a lateral spacing between the pair of supporting structures.

10. The method of claim 8, further comprising:
transferring the workpiece container to a processing tool after sealing the workpiece container.

11. The method of claim 8, further comprising:
disposing, by using the transport module, a wafer on another pair of supporting structures of the workpiece container.

12. The method of claim 11, further comprising:
determining a depositing height of the wafer in the workpiece container based on the vertical thickness of the workpiece.

13. The method of claim 8, wherein the workpiece carrier comprises a platform having a hollow therein, and disposing the workpiece on the workpiece carrier comprises moving an arm of the transport module gripping the workpiece to pass through the hollow and put the workpiece on the workpiece carrier.

14. The method of claim 8, further comprising:
cleaning an internal space of the workpiece container.

15. A method comprising:
disposing, by using a transport module of a workpiece storage system, a first workpiece carrier with a first workpiece on and in contact with top surfaces of a pair of first supporting floors of a front opening unified pod (FOUP), wherein the pair of first supporting floors are fixed on inner sidewalls of the FOUP, and a bottommost surface of the first workpiece carrier is lower than the top surfaces of the first supporting floors;
disposing, by using the transport module, a second workpiece in the FOUP, wherein the second workpiece is supported by a pair of second supporting floors fixed on the inner sidewalls of the FOUP;
after disposing the first workpiece carrier and the second workpiece, sealing the FOUP; and
transferring, by using the transport module, the FOUP to a stocker.

16. The method of claim 15, wherein the FOUP further comprises a pair of third supporting floors fixed on the inner sidewalls of the FOUP and over the pair of first supporting floors, and a top surface of the first workpiece is higher than top surfaces of the third supporting floors.

17. The method of claim 15, wherein the first workpiece has a width smaller than a lateral distance between the pair of first supporting floors.

18. The method of claim 15, further comprising disposing, by using the transport module, a wafer on and in contact with top surfaces of a pair of third supporting floors fixed on the inner sidewalls of the FOUP.

19. The method of claim 15, further comprising detecting, by using a storage condition sensor on a surface of the first workpiece carrier, a storage condition inside the FOUP.

20. The method of claim 15, further comprising controlling, by using a gas distribution module of the workpiece storage system, a storage condition inside the FOUP.

* * * * *